(12) United States Patent
Daneman et al.

(10) Patent No.: US 9,035,428 B2
(45) Date of Patent: May 19, 2015

(54) INTEGRATED STRUCTURE WITH BIDIRECTIONAL VERTICAL ACTUATION

(71) Applicant: Invensense, Inc., Sunnyvale, CA (US)

(72) Inventors: Michael Julian Daneman, Campbell, CA (US); Martin Lim, San Mateo, CA (US); Li-Wen Hung, Wappingers Falls, NY (US); Stephen Lloyd, Los Altos, CA (US)

(73) Assignee: INVENSENSE, INC., San Jose, CA (US)

( * ) Notice: Subject to any disclaimer, the term of this patent is extended or adjusted under 35 U.S.C. 154(b) by 111 days.

(21) Appl. No.: 13/831,470

(22) Filed: Mar. 14, 2013

(65) Prior Publication Data

US 2014/0264645 A1 Sep. 18, 2014

(51) Int. Cl.
*H01L 29/93* (2006.01)
*H01L 27/12* (2006.01)
*B81B 3/00* (2006.01)

(52) U.S. Cl.
CPC .......... *H01L 27/1203* (2013.01); *B81B 3/0056* (2013.01); *B81B 2201/0221* (2013.01); *B81B 2203/053* (2013.01)

(58) Field of Classification Search
USPC ................................................. 257/600, 602
See application file for complete search history.

(56) References Cited

U.S. PATENT DOCUMENTS

| | | | |
|---|---|---|---|
| 7,442,570 B2 | 10/2008 | Nasiri et al. | |
| 2006/0208326 A1 | 9/2006 | Nasiri et al. | |
| 2007/0290282 A1* | 12/2007 | Belov et al. | 257/421 |
| 2008/0284277 A1* | 11/2008 | Kwon et al. | 310/309 |
| 2011/0155548 A1* | 6/2011 | Foster et al. | 200/181 |
| 2013/0001710 A1 | 1/2013 | Daneman et al. | |
| 2013/0049646 A1* | 2/2013 | Kim et al. | 318/116 |
| 2013/0058202 A1* | 3/2013 | Chou et al. | 369/126 |

FOREIGN PATENT DOCUMENTS

WO   WO2013003789   1/2013

* cited by examiner

*Primary Examiner* — Daniel Luke
(74) *Attorney, Agent, or Firm* — Maryam Imam; IPxLaw Group LLP

(57) ABSTRACT

A Micro-Electro-Mechanical Systems (MEMS) device includes a first substrate with a first surface and a second surface, the first substrate including a base layer, a moveable beam disposed on the base layer, at least one metal layer, and one or more standoffs disposed on the base layer such that one or more metal layers are situated on the top surface of the one or more standoffs. The MEMS device further includes a second substrate including one or more metal layers bonded to the one or more standoffs resulting in an electrical connection between at least a portion of the one or more metal layers of the second substrate and one or more of the at least one electrode on the bottom surface and the at least one electrode on the top surface.

24 Claims, 6 Drawing Sheets

INTEGRATED STRUCTURE WITH BIDIRECTIONAL VERTICAL ACTUATION

BACKGROUND

Various methods and embodiments of the invention relate generally to a Micro-Electro-Mechanical Systems (MEMS) device and particularly to a MEMS device integrally fabricated with CMOS devices.

High frequency devices, such as switches, radio frequency (RF) communication devices, and variable capacitors have been long manufactured using photolithography techniques. However, manufacturing of such high frequency devices presents challenges not otherwise experienced by other devices, such as accelerometers and sensors.

Capacitors are typically made of two plates, or electrodes, separated by a dielectric. A variable capacitor is made of the same except that one of the plates, or electrodes, is moveable thereby varying capacitance. MEMS devices readily implement variable capacitors.

A particular variable capacitor, namely, MEMS tunable capacitors with a moveable electrode are able to achieve high capacitance on-off ratios. However, existing designs often have to balance the actuation voltage against the possibility of self-actuation due to the RF signal passing through the capacitor. High actuation voltages are difficult to generate on-chip and can lead to undesirable effects such as dielectric break-down and arcing. However, if the actuation voltage is too low, the moveable capacitor electrode may move and self-actuate due to the effective direct current (DC) electrostatic force produced by the RF signal. Another issue with existing MEMS variable capacitor designs is integration with control electronics.

In some prior art designs, the variable capacitors have either been built on top of a CMOS wafer or using side-by-side system-in-package (SIP) module approach. The former approach has the disadvantage of requiring a very thick isolation layer between the CMOS and MEMS to avoid RF parasitics and potential process conflicts between the MEMS and CMOS processes. The latter SIP approach produces larger package size which is undesirable for space-conscious mobile applications. Finally, sealing the MEMS devices is challenging. In some approaches a silicon cap wafer with etched cavities may be bonded to the MEMS/CMOS wafer, however, this step may be expensive requiring multiple lithography and deposition steps.

Alternately, a sacrificial layer and dielectric cap layer with release holes may be deposited over the MEMS, followed by a sacrificial release and another deposition to seal the holes in the cap layer. This approach has two disadvantages: 1) The release process can be long and non-uniform due to the requirement to keep the release holes in the cap layer small, and 2) The resulting dielectric cap is thin and fragile and may be damaged by deposition of solder balls and printed circuit board (PCB) attachment thereby forcing a larger chip footprint due to the requirement to place solder balls outside of the cap surface.

Accordingly, the need arises for MEMS devices integrally manufactured with CMOS devices and suitable for high frequency applications.

SUMMARY

Briefly, an embodiment of the invention includes a Micro-Electro-Mechanical Systems (MEMS) device having a first substrate with a first surface and a second surface, the first substrate including a base layer, a moveable beam disposed on the base layer, at least one metal layer, and one or more standoffs disposed on the base layer such that one or more metal layers are situated on the top surface of the one or more standoffs. The MEMS device further includes a second substrate including one or more metal layers bonded to the one or more standoffs resulting in an electrical connection between at least a portion of the one or more metal layers of the second substrate and one or more of the at least one electrode on the bottom surface and the at least one electrode on the top surface.

A further understanding of the nature and the advantages of particular embodiments disclosed herein may be realized by reference of the remaining portions of the specification and the attached drawings.

DETAILED DESCRIPTION OF EMBODIMENTS

In the described embodiments Micro-Electro-Mechanical Systems (MEMS) refers to a class of structures or devices fabricated using semiconductor-like processes and exhibiting mechanical characteristics such as the ability to move or deform. MEMS often, but not always, interact with electrical signals. MEMS devices include but are not limited to gyroscopes, accelerometers, magnetometers, microphones, pressure sensors, and radio-frequency (RF) components. Silicon wafers containing MEMS structures are referred to as MEMS wafers.

In the described embodiments, a MEMS device may refer to a semiconductor device implemented as a micro-electro-mechanical system. MEMS structure may refer to any feature that may be part of a larger MEMS device. An engineered silicon-on-insulator (ESOI) wafer may refer to a SOI wafer with cavities beneath the silicon device layer or substrate. Handle wafer typically refers to a thicker substrate used as a carrier for the thinner silicon device substrate in a silicon-on-insulator wafer. Handle substrate, handle wafer, can be interchanged.

In the described embodiments, a cavity may refer to an opening or recession in a substrate wafer and enclosure may refer to a fully enclosed space. Bond chamber may be an enclosure in a piece of bonding equipment where the wafer bonding process takes place. The atmosphere in the bond chamber determines the atmosphere sealed in the bonded wafers.

The following description describes a MEMS devices and methods for manufacturing the same, in accordance with various techniques.

Particular embodiments and methods of the invention disclose a MEMS device having a first substrate that has a first surface and a second surface. The first substrate includes a base layer, and a moveable beam, which is disposed on the base layer. Further, at least one metal layer, and one or more standoffs are disposed on the base layer such that the one or more metal layers are situated on the top surface of the one or more standoffs. The MEMS device further includes a second substrate, bonded to the first substrate, that includes one or more metal layers bonded to the one or more standoffs resulting in an electrical connection between at least a portion of the one or more metal layers of the second substrate and the one or more of the at least one electrode on the bottom surface and the at least one electrode on the top surface.

Figure 1A:
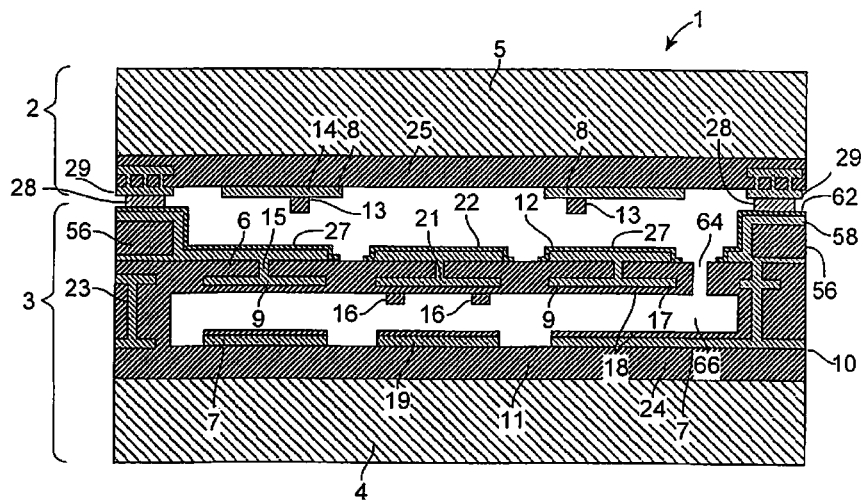
FIG. 1a shows a MEMS device, in accordance with an embodiment of the invention.

Referring now to FIG. 1a, a MEMS device 1 is shown, in accordance with an embodiment of the invention. The MEMS device 1 is shown to have a substrate 2 and a MEMS substrate 3 that are bonded together and vertically, as will become evident shortly.

The MEMS substrate 3 is shown to include the base layer 4 on top of which is shown formed a thick insulator layer 24. In an embodiment, base layer 4 may be made of a semiconductor material. On top of the layer 24 is shown formed from a first metal layer 10 bottom actuation electrodes 7 and on top of the electrodes 7 are shown formed a thin insulating layer 18. The layer 18 is also shown formed above a cavity 66, which is shown disposed between the layers 18 as well as on top of the layer 24. Further formed on top of the layer 24 and in between the bottom actuation electrodes 7 is a second capacitor electrode 19.

The MEMS substrate 3 is additionally shown to include spacers 16 on the bottom surface of the layer 18, shown above the cavity 66. Center actuation electrodes 9 are shown formed above the cavity 66 and the layer 18, shown positioned above the cavity 66 and on either side of a first capacitor electrode 21. Accordingly, the electrode 7 and the electrode 9, which is shown positioned directly above the electrode 7, in FIG. 1a, form center actuation electrodes. Additionally, the electrodes 7 and 9 and the layer 18 are shown formed on the electrode 7, on a bottom surface, and the layer 18 is shown formed below the electrode 9, on a top surface, all of which define a moveable beam.

Shown formed on top of the electrodes 9 and 21 is an insulator layer 6 and on top of the insulator layer 6 is shown formed a patterned metal layer 58. A barrier layer 22 is formed above the layer 58. Above the MEMS substrate 3, as described above in reference to FIG. 1a, the substrate 2 is formed and bonded to the MEMS substrate 3 by a germanium (Ge) layer 28.

The substrate 2 may be a CMOS wafer containing electrodes and one or more circuits and active elements.

The substrate 3 is shown to include standoffs 56 that are disposed on top of the layer 6 and substantially above the electrodes 9. Each of the electrodes 9 is shown to have a spacer formed on a bottom surface thereof. An insulator layer 25 is shown formed below the substrate 5 and above the electrodes 8 and between the substrate 5 and the standoffs 56.

It is noted that the electrode 21 is suspended over the base layer 4 and in operation, when a voltage is applied between the electrodes 9 and the electrodes 7, an electrostatic force pulls the moveable element towards the base layer 4. The spacers 16 serve to prevent the electrodes 9 and 21 and the electrodes 7 and 19 from coming in contact with each other when the moveable element is pulled down. Similarly, the spacers 13 of the substrate 2 serve to prevent the electrodes 8 and the metal layer 27 from coming in contact with each other. Alternatively, additional spacers may be formed below the layer 25 but their height need be suitable to prevent contact between the electrodes 8 and the layer 27.

The capacitance between the first and second capacitor electrodes, i.e. electrodes 21 and 19 in FIG. 1a, is a function of the gap between them and the thickness and dielectric constant of the thin insulating layer 18, the gap shown in FIG. 1a as the cavity 66, varies as the distance between the moveable element and the base layer 4 varies. More specifically, as the gap varies, so does the capacitance of the capacitor formed from the electrode 21 and 19, which makes this capacitor a variable one.

During operation, when the electrode 21 is pulled down, the capacitance increases. That is, when voltage is applied to the device 1, the electrodes 9 and 21 are pulled up and down, relative to the base layer 4, as a function of the electrodes 8 pulling up or electrodes 7 pulling down, relative to the base layer 4. Stated differently, when a voltage is applied between the electrodes 8 and 9, the moveable element is pulled towards the substrate 2 and away from the base layer 4, while when a voltage is applied between electrodes 7 and 9, the moveable element is pulled towards base layer 4 and away from substrate 2.

Figure 1B:
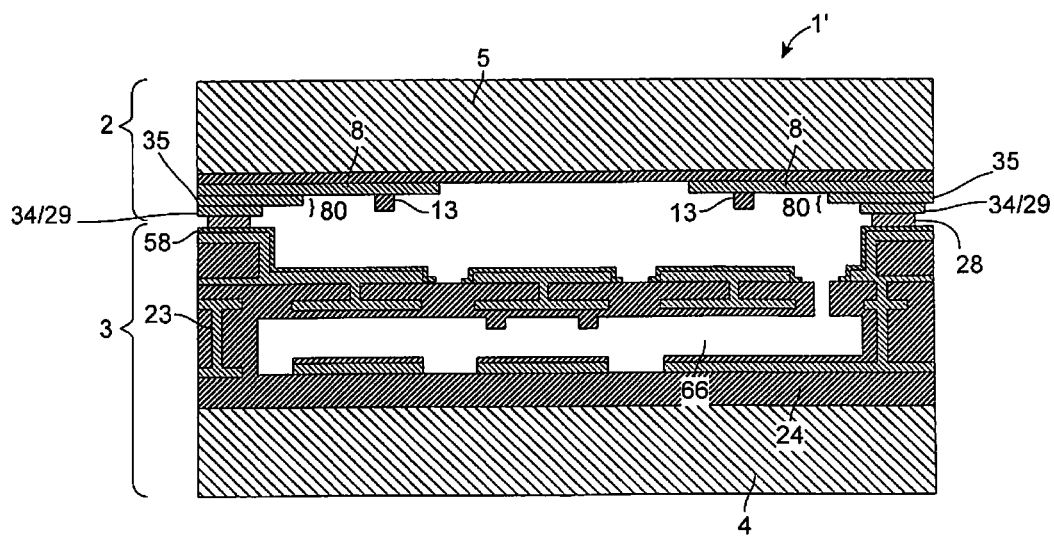
FIG. 1b shows a MEMS device, in accordance with another embodiment of the invention.

FIG. 1b shows a MEMS device 1', in accordance with another embodiment of the invention. The device 1' is analogous to the device 1 except that it includes standoffs 80 formed in the substrate 2 instead of the substrate 3. The standoffs 80 are shown formed from a portion of the top metal layer 34 and insulator layer 35 of the substrate 2 with the electrodes 8 formed from a lower CMOS metal layer in FIG. 1b, as opposed to the embodiment of FIG. 1a.

Figure 2A:
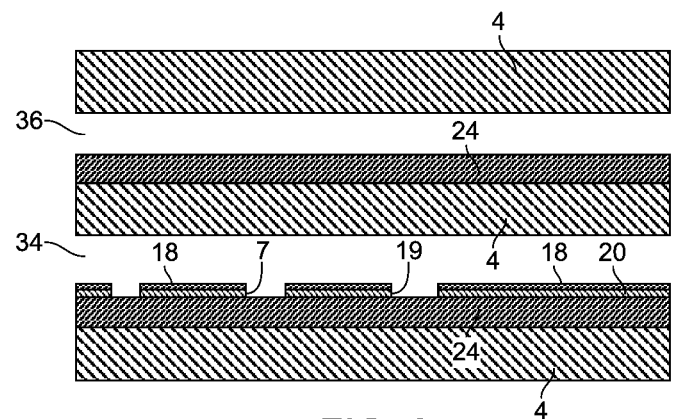
FIGS. 2a-2o show the relevant steps for manufacturing the MEMS device of FIGS. 1a and 1b.
Figure 2B:
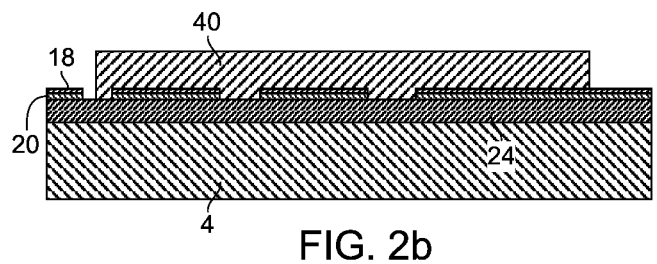
Figure 2C:
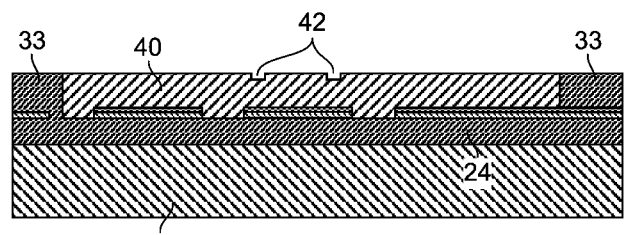
Figure 2D:
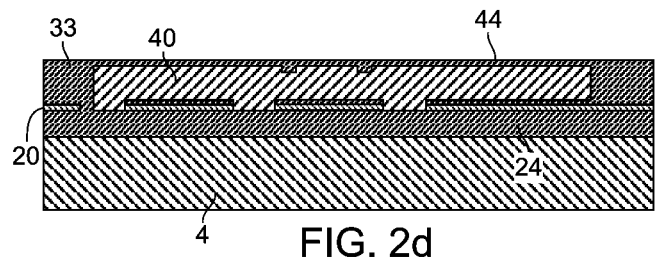
Figure 2E:
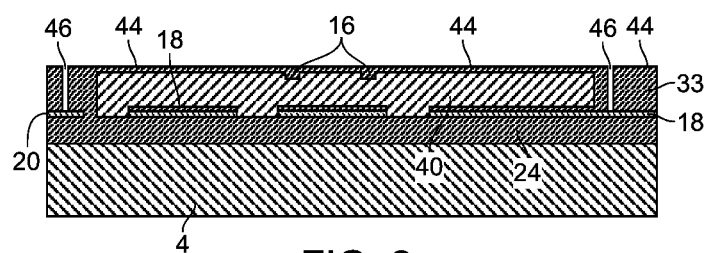
Figure 2F:
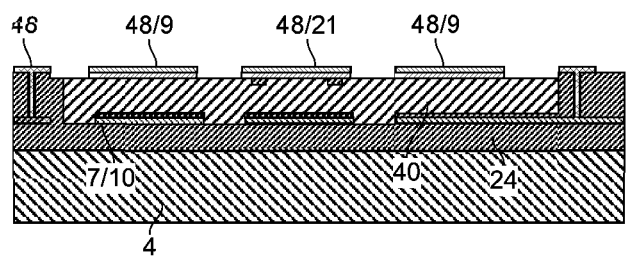
Figure 2G:
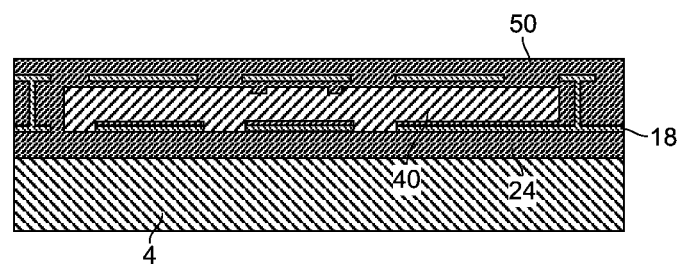
Figure 2H:
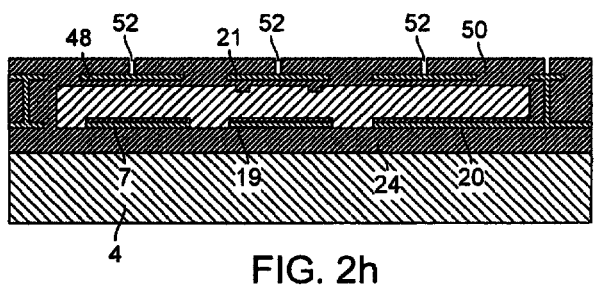
Figure 2I:
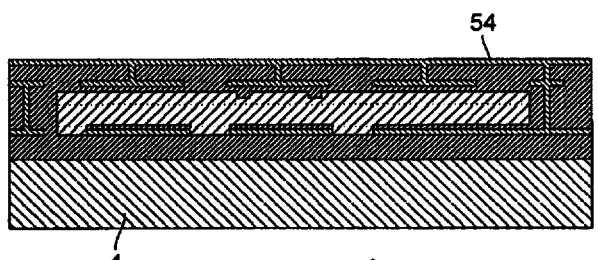
Figure 2J:
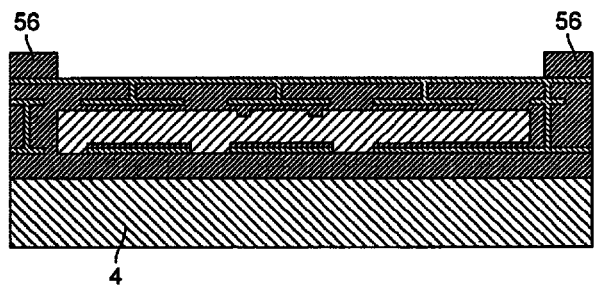
Figure 2K:
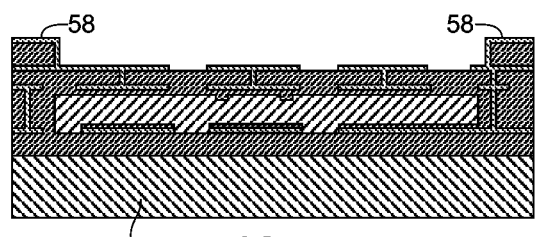
Figure 2L:
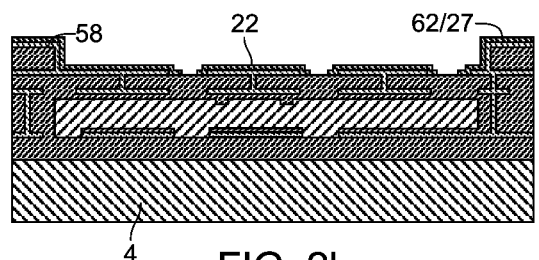
Figure 2M:
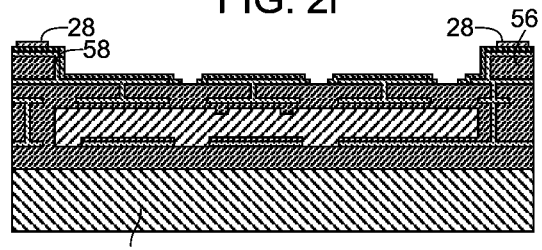
Figure 2N:
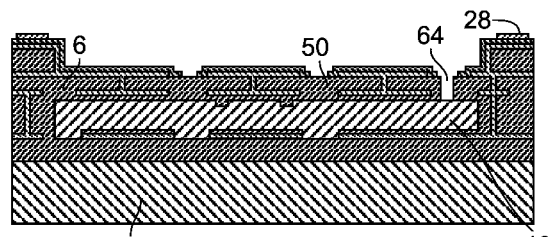
Figure 2O:
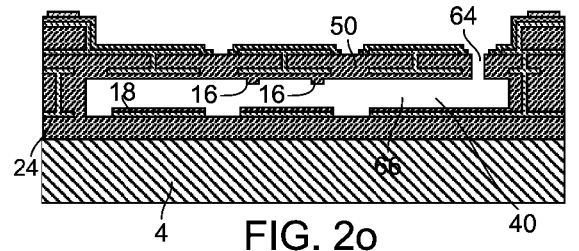

FIGS. 2a-2o show the relevant steps for manufacturing the MEMS device of FIGS. 1a and 1b. For the sake of brevity, FIG. 2a shows three steps in that first, the base layer 4 comprising a silicon substrate is provided, next the insulating layer 24 is formed on top of the base layer 4, followed by a third step of forming the electrodes 7, 19, and 20 on top of the layer 24 by first depositing a metal layer on top of the layer 24, and optionally subsequently depositing and etching the thin insulating layer 18. Accordingly, the electrodes 7, 20 and 19 are formed.

Next in FIG. 2b, a sacrificial layer 40 is deposited on top of the insulating layers 18, 24, and the first metal layer 20. An exemplary material of which the layer 40 is made is polycrystalline silicon. A silicon oxide layer 33 shown in FIG. 2c, of thickness greater than the sacrificial layer 40, is then deposited and subsequently, as shown in FIG. 2c, polished using, for example, chemical-mechanical polishing (CMP) or another technique to planarize the surface and expose the sacrificial layer 40. Shallow indents 42 are then etched in the sacrificial layer 40 to enable forming the spacers in the following layers.

Next, in FIG. 2d, another thin oxide layer 44 is then optionally deposited. FIG. 2e illustrates vias 46 formed through the insulating layers, such as the layer 44, the layer 33, and the layer 18, to the first metal 20. In FIG. 2f, vias 46 are then filled with a conformally deposited conductive material 47 (such as CVD Tungsten) and a second metal layer 48 is deposited and is connected to the conductive material 47 The second metal layer 48 is then patterned to form the electrodes 9 and 21 of the moveable element. The insulating layer 44 is also patterned together with second metal layer 48.

In FIG. 2g, an insulating structural layer 50, such as SiO2, is deposited and planarized using CMP or other suitable methods for planarizing. Subsequently, in FIG. 2h, the vias 52 are formed through the insulating structural layer 50 to the second metal layer 48 or the electrodes 9 and 21 of FIG. 1a. The vias 52 are filled with a conformal conductive material and a thin metal layer 54 is deposited on top of them, as shown in FIG. 2i.

Next, in FIG. 2j, a standoff 56 is formed from a deposited and patterned insulating layer. Then, in FIG. 2k, a third metal layer 58 is deposited and patterned to form electrodes on top of the moveable element. An optional conductive barrier layer 22 is deposited onto the metal layer 58 and patterned, shown at FIG. 2l.

In an embodiment where a eutectic bond is used to bond the substrate 2 to the substrate 3, the barrier layer 22 prevents the solder from reacting and liquefying the MEMS metal during the eutectic bond.

Next, in FIG. 2m, the Germanium (Ge) layer 28 is deposited and patterned such that it remains on the metal layer 58 on top of standoffs 56. The insulating layer 44, and insulating structural layer 50 are patterned, as shown in FIG. 2n, to define the moveable element, stopping on the sacrificial layer 40. Next, in FIG. 2o, the sacrificial layer 40 is removed in an isotropic sacrificial etch that selectively etches the sacrificial layer 40 but that does not etch or minimally etch the metal and oxide layers above and below the layer 40, such as the insulating layers 50, 44, 24, and 18. In a preferred embodiment, the sacrificial etch uses $XeF_2$.

Figure 3:
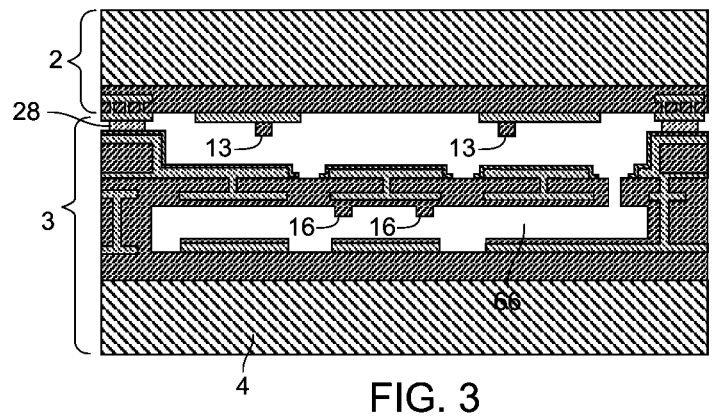
FIG. 3 shows the MEMS device of FIG. 1a and FIG. 1b after the CMOS substrate has been bonded to the MEMS substrate.

At this point in the process, the moveable element is released and capable of moving. FIG. 3 shows the MEMS device of FIG. 1a and FIG. 1b after the CMOS substrate 2 has been bonded to the MEMS substrate 3.

Next in the manufacturing process of the device 1, as shown in FIG. 3, the substrate 3 is bonded to a substrate 2 using a eutectic bond, for example. Between the Germanium layer 28 deposited onto the MEMS and Aluminum 29 on the CMOS. The bond creates a hermetic seal around the MEMS elements as well as establishes electrical connections between the MEMS metal and CMOS metal.

Figure 4:
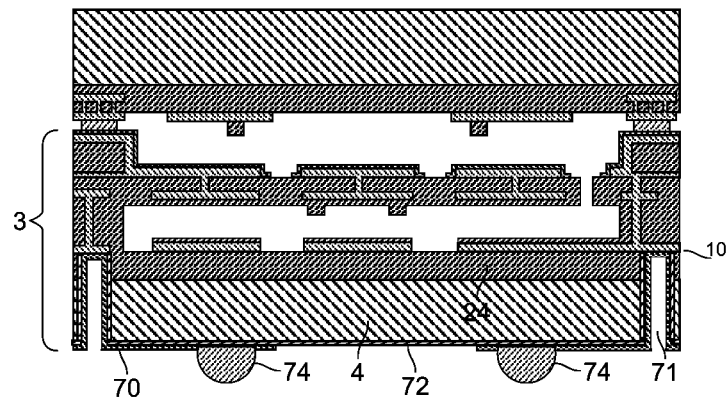
FIG. 4 shows the MEMS device of FIGS. 1a and 1b manufactured in preparation for packaging, in accordance with an embodiment of the invention.

FIG. 4 shows the MEMS device of FIGS. 1a and 1b manufactured in a Chip-Scale-Packaging (CSP) configuration, in accordance with an embodiment of the invention. As a packaging approach, the device 1 may be packaged using Through-Silicon-Via (TSV) Chip-Scale-Packaging (CSP) technology, shown in FIG. 4. In this embodiment, vias 71 are etched in the back of the substrate 3 exposing the first metal layer 10. An insulating layer 72 is deposited onto the back surface of substrate 3 and into the vias. Then, the insulating layer 72 is removed at the bottom of the vias and a redistribution metal layer 70 is deposited into the vias and on the back surface of the substrate 3 such that the metal 70 makes electrical contact with the first metal layer 10 inside the vias. The redistribution layer 70 is patterned, and an optional insulating solder mask layer is then deposited and patterned, and then solder balls 74 are optionally formed on the redistribution layer 70 to enable assembly of the device 1 onto a printed circuit board (PCB) or other types of substrates.

Figure 5:
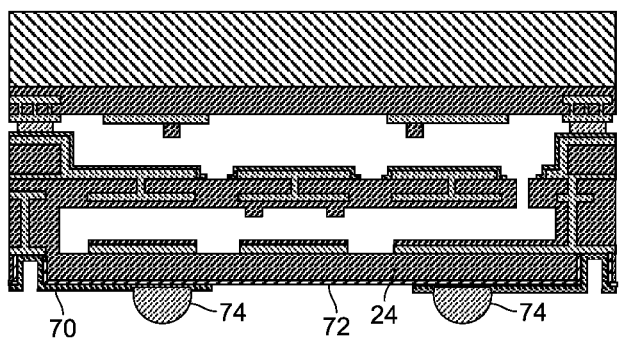
FIG. 5 shows the MEMS device of FIGS. 1a and 1b manufactured in preparation for packaging, in accordance with another embodiment of the invention.

FIG. 5 shows the MEMS device of FIGS. 1a and 1b manufactured in a Chip-Scale-Packaging configuration, in accordance with another embodiment of the invention. As shown in FIG. 5, optionally, the base layer 4 illustrated in FIG. 4 is removed prior to via formation by grinding, etching, or another method, exposing the bottom insulating layer which acts as the cap for the device 1 or 1', leaving only an insulating cap that advantageously reduces parasitic capacitances in the via metallization.

Although the invention has been described with respect to particular embodiments thereof, these particular embodiments are merely illustrative, and not restrictive.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

Thus, while particular embodiments have been described herein, latitudes of modification, various changes, and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit.

The invention claimed is:

1. A MEMS device comprising:
   a first substrate having a first surface and a second surface, the first substrate comprising,
   a base layer,
   a moveable beam attached to the base layer and having a top surface and a bottom surface, the bottom surface facing the base layer, the moveable beam comprising:
   one or more first electrodes disposed on the bottom surface of the moveable beam,
   one or more second electrodes disposed on the top surface of the moveable beam,
   one or more standoffs disposed on the first surface of the first substrate such that one or more conductive layers are situated on a top surface of the one or more standoffs; and
   a second substrate comprising one or more metal layers bonded to the one or more standoffs resulting in an electrical connection between at least a portion of the one or more metal layers and one of the one or more of the first electrodes or -the one or more of the second electrodes.

2. The MEMS device of claim 1, wherein an insulating layer is disposed between the one or more first electrodes and the one or more second electrodes.

3. The MEMS device of claim 1 further comprising one or more -third electrodes disposed between the moveable beam and the base layer, such that the moveable beam is displaced when an electric potential is applied between the at least one of the one or more third electrodes and the at least one of the one or more first electrodes.

4. The MEMS device of claim 3, wherein the at least one of the one or more first electrodes carries a radio frequency signal.

5. The MEMS device of claim 3, wherein the at least one of the one or more third electrodes carries a radio frequency signal.

6. The MEMS device of claim 3, further comprising one or more spacers disposed between the one or more first electrodes and the one or more third electrodes.

7. The MEMS device of claim 3, further comprising one or more fourth electrodes disposed on the second substrate, the one or more fourth electrodes exerting an electrostatic force on the moveable beam when an electric potential is applied between the one or more fourth electrodes and the at least one of the one or more second electrodes.

8. The MEMS device of claim 7, further comprising one or more spacers disposed between the one or more second electrodes and one or more fourth electrodes.

9. The MEMS device of claim 1, further comprising at least one CMOS circuit on the second substrate.

10. The MEMS device of claim 1 further comprising a redistribution layer, the redistribution layer disposed on the second surface of the first substrate.

11. The MEMS device of claim 10, further comprising an insulating layer disposed between the first substrate and the redistribution layer.

12. The MEMS device of claim 10, further comprising an electrical conducting path from the redistribution layer to at least one of the one or more third electrodes.

13. The MEMS device of claim 12 further comprising solder balls disposed on the redistribution layer.

14. The MEMS device of claim 12, further comprising one or more vias in the first substrate wherein the one or more vias contains a conductive material.

15. A MEMS device comprising:
a first substrate having a first surface and a second surface, the first substrate comprising,
a base layer,
a moveable beam attached to the base layer and having a top surface and a bottom surface, the bottom surface facing the base layer, the moveable beam comprising,
one or more first electrodes disposed on the bottom surface of the moveable beam,
one or more second electrodes disposed on the top surface of the moveable beam,
a first insulating layer disposed between the one or more first electrodes and the one or more second electrodes; and
a second substrate comprising:
one or more metal layers separated from one another by one or more insulating layers;
one or more standoffs having a top surface and formed from a portion of the one or more metal layers and one or more second insulating layers, a portion of the one or more metal layers situated on the top surface of the one or more standoffs and bonded to the first substrate such that an electrical connection is formed between the portion of one or more metal layers and at least one of the one or more first electrodes or at least one of the one or more second electrodes.

16. Device of claim 15 further comprising one or more -third electrodes disposed between the moveable beam and the base layer, such that the moveable beam is displaced when an electric potential is applied between the at least one of the one or more third electrodes and the at least one of the one or more first electrodes.

17. The MEMS device of claim 16, wherein the at least one of the one or more first electrodes carries a radio frequency signal.

18. The MEMS device of claim 16, wherein the at least one of the one or more third electrodes carries a radio frequency signal.

19. The MEMS device of claim 16, further comprising one or more spacers disposed between the one or more first electrodes and the one or more third electrodes.

20. The MEMS device of claim 16, further comprising one or more fourth electrodes disposed on the second substrate, the one or more fourth electrodes exerting an electrostatic force on the moveable beam when an electric potential is applied between the one or more fourth electrodes and the at least one of the one or more second electrodes.

21. The MEMS device of claim 20, further comprising one or more spacers disposed between the one or more second electrodes and one or more fourth electrodes.

22. The MEMS device of claim 15, further comprising at least one CMOS circuit on the second substrate.

23. A MEMS device comprising:
a base layer having a first surface;
at least one first actuation electrode disposed on the first surface of the base layer;
at least one first capacitor electrode disposed on the first surface of the base layer;
a moveable beam having a top surface and a bottom surface, the moveable beam disposed above the at least one first actuation electrode and the at least one first capacitor electrode,
wherein the moveable beam is attached to the base layer,
wherein the bottom surface is facing the base layer,
wherein the moveable beam further comprises,
at least one second actuation electrode disposed on the bottom surface of the moveable beam,
at least one third actuation electrode disposed on the top surface of the moveable beam,
at least one second capacitor electrode disposed on the bottom surface of the moveable beam,
at least one fourth actuation electrode disposed above the moveable beam,
wherein applying an electric potential between the at least one first actuation electrode and the at least one second actuation electrode displaces the moveable beam towards the at least one first actuation electrode,
wherein applying an electric potential between the at least one third actuation electrode and the at least one fourth actuation electrode produces an electrostatic force on the moveable beam towards the at least one fourth actuation electrode.

24. The -MEMS device of claim 23 further comprising:
a first electrostatic force generated by an electrical signal applied between the at least one first capacitor electrode and the at least one second capacitor electrode; and
a second electrostatic force generated by a second electric potential applied between the at least one third actuation electrode and the at least one fourth actuation electrode, wherein the second electrostatic force counteracts the first electrostatic force.

\* \* \* \* \*